(12) United States Patent
Joshi et al.

(10) Patent No.: US 10,749,216 B2
(45) Date of Patent: Aug. 18, 2020

(54) BATTERY, INTEGRATED CIRCUIT AND METHOD OF MANUFACTURING A BATTERY

(71) Applicant: Infineon Technologies AG, Neubiberg (DE)

(72) Inventors: Ravi Keshav Joshi, Villach (AT); Alexander Breymesser, Villach (AT); Bernhard Goller, Villach (AT); Kamil Karlovsky, Bratislava (SK); Francisco Javier Santos Rodriguez, Villach (AT); Peter Zorn, Villach (AT)

(73) Assignee: Infineon Technologies AG, Neubiberg (DE)

( * ) Notice: Subject to any disclaimer, the term of this patent is extended or adjusted under 35 U.S.C. 154(b) by 663 days.

(21) Appl. No.: 14/230,056

(22) Filed: Mar. 31, 2014

(65) Prior Publication Data

US 2015/0280287 A1    Oct. 1, 2015

(51) Int. Cl.
*H01L 23/58* (2006.01)
*H01M 10/42* (2006.01)
(Continued)

(52) U.S. Cl.
CPC ........ *H01M 10/4257* (2013.01); *H01L 23/58* (2013.01); *H01M 2/0202* (2013.01);
(Continued)

(58) Field of Classification Search
CPC ........... H01M 10/4257; H01M 10/052; H01M 10/0585; H01M 2/0202; H01M 2/024;
(Continued)

(56) References Cited

U.S. PATENT DOCUMENTS

| 4,859,263 A | * | 8/1989 | Dziurla | H05K 3/046 |
| | | | | 156/233 |
| 5,864,182 A | * | 1/1999 | Matsuzaki | G11C 5/141 |
| | | | | 257/684 |

(Continued)

FOREIGN PATENT DOCUMENTS

| CN | 1853297 A | 10/2006 |
| CN | 1860568 A | 11/2006 |

(Continued)

OTHER PUBLICATIONS

Hahn, R et al, "Silicon Integrated Micro Batteries Based on Deep Reactive Ion Etching and Through Silicon Via Technologies," IEEE 2012, pp. 1571-1577.

*Primary Examiner* — Stephen J Yanchuk
(74) *Attorney, Agent, or Firm* — Murphy, Bilak & Homiller, PLLC

(57) ABSTRACT

A battery includes a first substrate having a first main surface, a second substrate made of a conducting material or semiconductor material, and a carrier of an insulating material. The carrier has a first and a second main surfaces, the second substrate being attached to the first main surface of the carrier. An opening is formed in the second main surface of the carrier to uncover a portion of a second main surface of the second substrate. The second main surface of the carrier is attached to the first substrate, thereby forming a cavity. The battery further includes an electrolyte disposed in the cavity.

20 Claims, 13 Drawing Sheets

(51) Int. Cl.
  *H01M 10/0585* (2010.01)
  *H01M 10/052* (2010.01)
  *H01M 2/02* (2006.01)

(52) U.S. Cl.
  CPC ......... *H01M 2/024* (2013.01); *H01M 10/052* (2013.01); *H01M 10/0585* (2013.01); *H01L 2924/0002* (2013.01); *H01M 2/0207* (2013.01); *Y10T 29/49108* (2015.01)

(58) Field of Classification Search
  CPC .................................................. H01M 2/0207;
         H01L 23/58; Y10T 29/49108; Y10T 2924/0002; Y10T 2924/00
  See application file for complete search history.

(56) References Cited

U.S. PATENT DOCUMENTS 6,251,540 B1 * 6/2001 Kejha .................. H01M 4/382
                                                            429/233
  6,333,565 B1    12/2001 Hashimoto
  2003/0152815 A1 * 8/2003 LaFollette ........... H01M 2/0202
                                                            429/7
  2004/0131925 A1 * 7/2004 Jenson .................... H01M 6/40
                                                            429/61
  2006/0113652 A1 * 6/2006 Mino ...................... H01L 23/58
                                                            257/684
  2007/0275300 A1 * 11/2007 Salot ...................... H01G 9/016
                                                            429/163
  2008/0050656 A1    2/2008 Eisenbeiser et al.
  2011/0183186 A1 * 7/2011 Klootwijk ........... H01M 2/1061
                                                            429/160
  2012/0007749 A1    1/2012 Oldknow et al.
  2012/0021280 A1    1/2012 Katase et al.
  2012/0034541 A1    2/2012 Muraoka et al.
  2013/0183575 A1    7/2013 Goto et al.
  2014/0212735 A1    7/2014 Li et al.

FOREIGN PATENT DOCUMENTS

CN      101471186 A    7/2009
  CN      101771168 A    7/2010
  CN      102598365 A    7/2012
  WO      2004051768 A1  6/2004

* cited by examiner

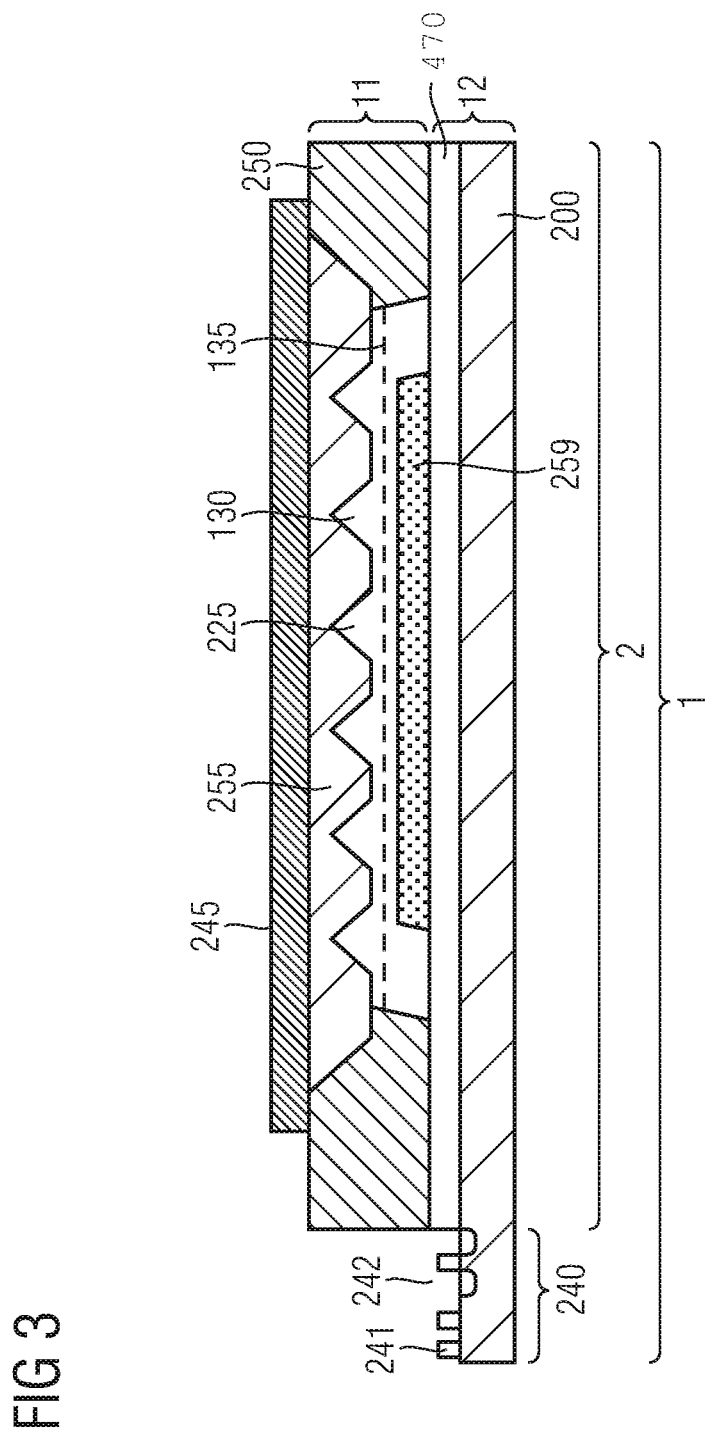

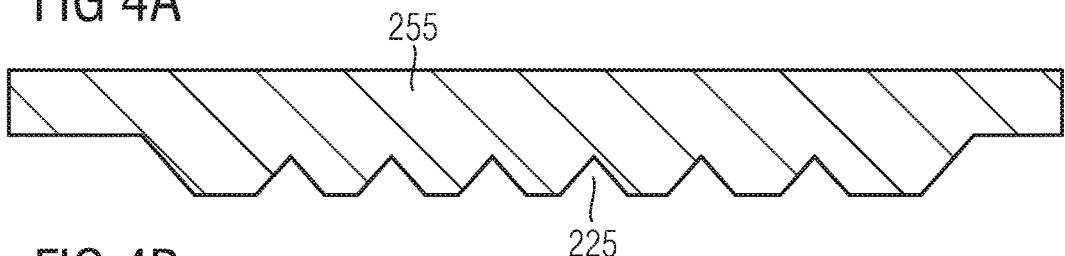
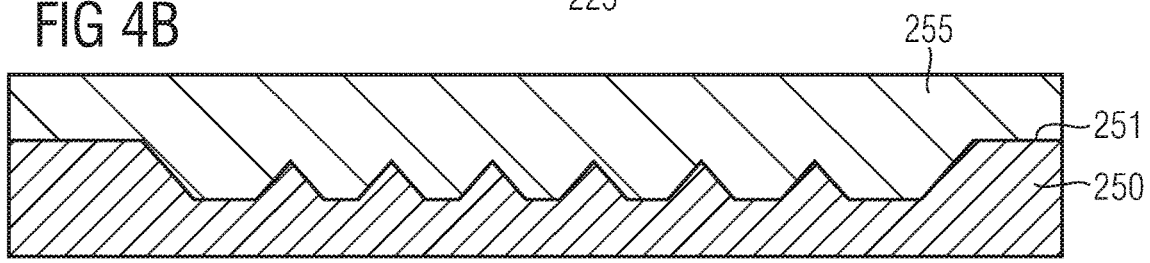
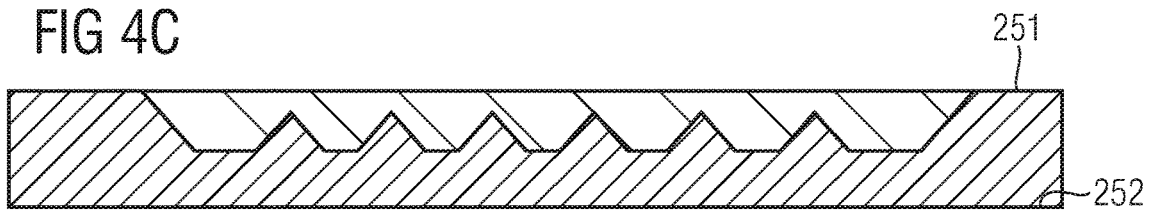
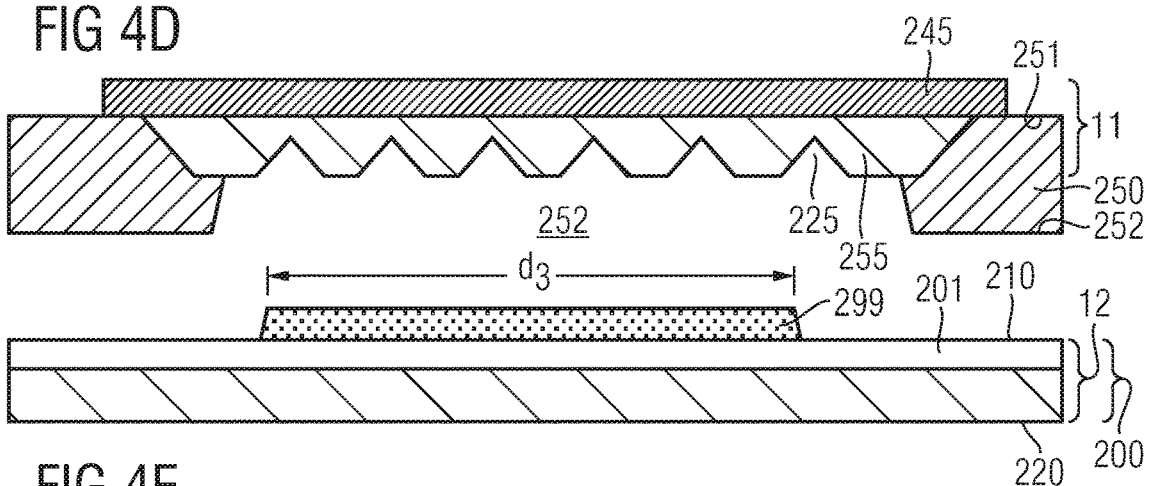
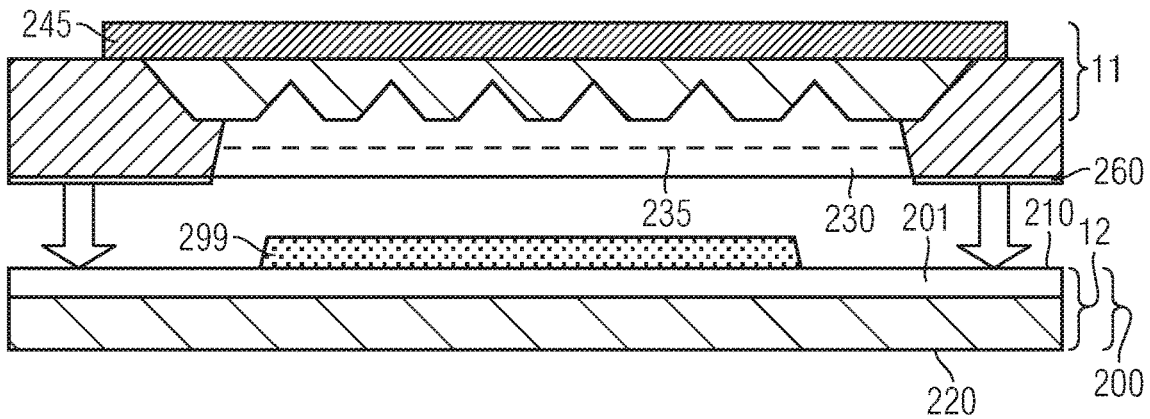

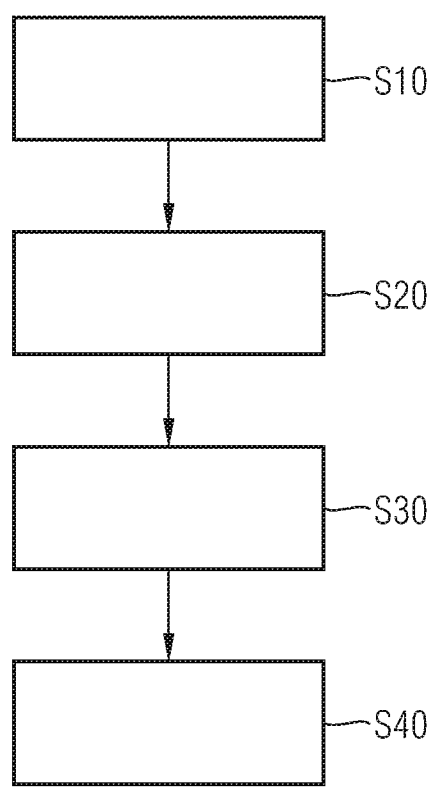

BATTERY, INTEGRATED CIRCUIT AND METHOD OF MANUFACTURING A BATTERY

BACKGROUND

With the increased use of portable electronic devices such as notebooks, portable telephones, cameras and others and with the increased use of current-driven automobiles, lithium ion secondary batteries with high energy density have attracted increasing attention as a power source.

Further, attempts are being made for providing semiconductor devices or semiconductor-based devices having an integrated power source.

Lithium ion secondary batteries typically include a cathode comprising a lithium-containing transition metal oxide or the like, an anode typically made of a carbon material and a non-aqueous electrolyte containing a lithium salt as well as a separator situated between the anode and the cathode.

In order to meet the increasing demands on capacity and performance, new concepts for lithium batteries that can be manufactured in a simple manner are desirable.

SUMMARY

According to an embodiment, a battery comprises a first substrate having a first main surface, a second substrate made of a conducting material or a semiconductor material, and a carrier of an insulating material having first and second main surfaces, the second substrate being attached to the first main surface of the carrier. An opening is formed in the second main surface of the carrier to uncover a portion of a second main surface of the second substrate. The second main surface of the carrier is attached to the first substrate, thereby forming a cavity. The battery further comprises an electrolyte disposed in the cavity.

According to an embodiment, an integrated circuit includes a battery comprising a first substrate having a first main surface, a second substrate made of a conducting or semiconductor material, and a carrier of an insulating material, having a first and a second main surfaces, the second substrate being attached to the first main surface of the carrier. An opening is formed in the second main surface of the carrier to uncover a portion of a second main surface of the second substrate, and the second main surface of the carrier is attached to the first main surface of the first substrate, thereby forming a cavity. The integrated circuit further comprises an electrolyte disposed in the cavity.

According to an embodiment, a method of manufacturing a battery comprises forming a cavity in a stack including a first substrate, a carrier of an insulating material, and a second substrate made of a conductive or a semiconductor material. The method comprises attaching a second main surface of the second substrate to a first main surface of the carrier, forming an opening in the second main surface of the carrier to uncover a portion of a second main surface of the second substrate, attaching a first main surface of the first substrate to a second main surface of the carrier, and filling an electrolyte in the cavity.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 3 shows further example of an integrated circuited including a lithium according to an embodiment;

FIGS. 4A to 4E illustrate a further method of manufacturing an integrated circuit according to an embodiment;

FIG. 9 illustrates a general method of manufacturing a battery.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide.

According to other embodiments, silicon carbide (SiC) or gallium nitride (GaN) may form the semiconductor substrate material.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

Figure 1:
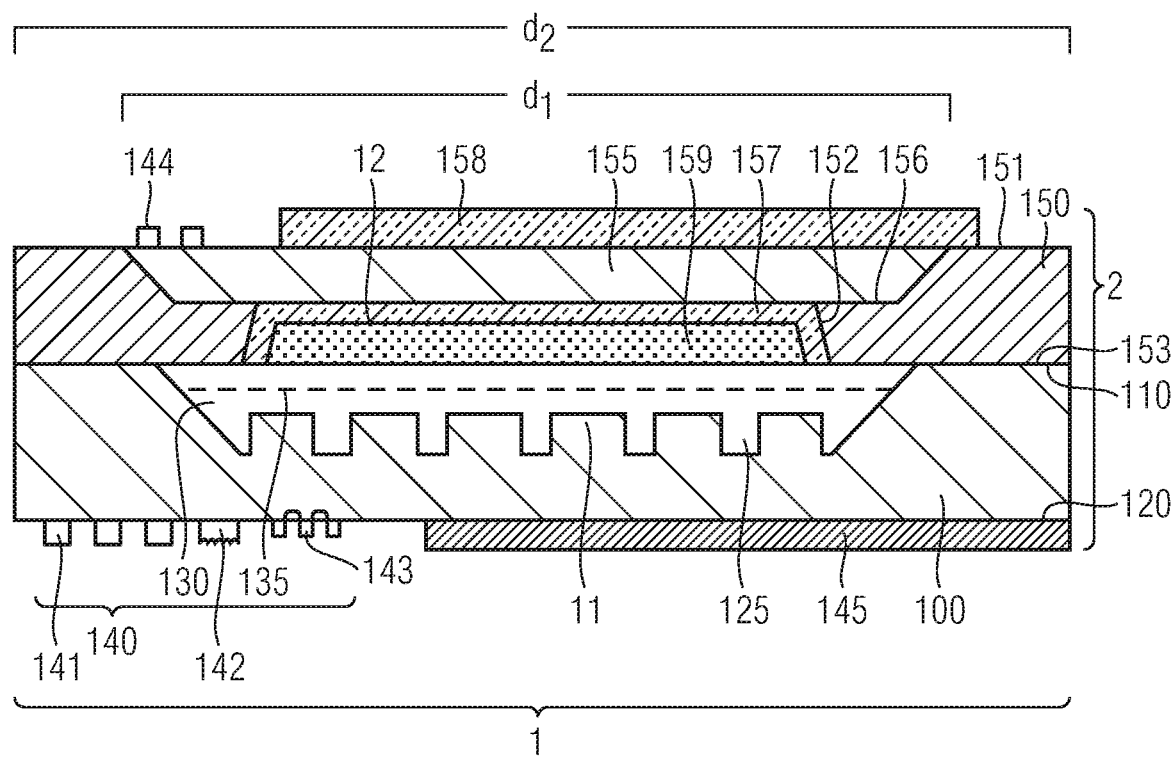
FIG. 1 shows a cross-sectional view of an integrated circuit including a lithium ion battery according to an embodiment.

FIG. 1 shows a cross-sectional view of an example of an integrated circuit 1 comprising a lithium ion battery 2. The lithium ion battery 2 shown in FIG. 1 comprises an anode 11, a cathode 12, an electrolyte 130 and a housing comprising a first substrate 100, a second substrate 155 and a carrier 150.

The anode 11 comprises a semiconductor material. For example, the anode 11 may comprise silicon material which may be monocrystalline, polycrystalline or amorphous. The silicon material may be doped with any dopant as is conventionally used such as boron (B), arsenic (As), phosphorous (P), antimony (Sb), gallium (Ga), indium (In) or selenium (Se). The active silicon surface of the anode 11 may be planar or patterned. For example, three-dimensional structures such as trenches, pyramids and columns may be formed in the surface of the anode. A thin metal layer (not shown) may be formed over the surface of the anode 11, the thin metal layer contacting the electrolyte 130. For example, the metal layer may comprise silver (Ag), aluminium (Al), gold (Au), palladium (Pd) or platinum (Pt). Metals forming an alloy with lithium may be used. Further examples comprise Zn, Cd, B, Ga, In, Th, C, Si, Ge, Sn, Pd, As, Sb, Bi, Se, and Te. A thickness of the metal layer may be less than 100 nm and more than 1 nm. Therefore, when applying an Ag-metal layer, an Ag—Li alloy will be formed at the surface of the anode 11 before charging the Si material with lithium so that the Li ions will move to the Si anode in a homogeneous manner. Further, due to the alloy layer, the formation of the native $SiO_2$ layer on the anode surface is prevented so that the transportation of ions is further enhanced. In addition, the incorporation of Li atoms in the Si anode will be accomplished in a more homogeneous manner so that the performance of a lithium ion battery will be improved. Due to the presence of the thin metal layer, the mechanical stability of the electrode during charging and discharging is enhanced. As is to be clearly understood, the anode may be made of silicon without the presence of the thin metal layer.

The cathode 12 may comprise one or more cathode materials. As a cathode material 159, generally known materials that are used in lithium ion batteries, such as $LiCoO_2$, $LiNiO_2$, $LiNi_{1-x}Co_xO_2$, $Li(NiO_{0.85}CO_{0.1}Al_{0.05})O_2$, $Li(Ni_{0.33}Co_{0.33}Mn_{0.33})O_2$, $LiMn_2O_4$ spinel and $LiFePO_4$. As a further example, the cathode may comprise a matrix of NiCoAl oxide (NCA) including intercalated lithium. The materials forming the cathode may be implemented as a layer formed over a suitable substrate or an insulating carrier.

The electrolyte 130 may include electrolytes commonly used for lithium batteries such as e.g. $LiPF_6$, $LiBF_4$ or salts which do not include fluorine such as $LiPCl_6$, $LiClO_4$, in water-free aprotic solvents such as propylene carbonate, dimethyl carbonate or 1,2-dimethoxymethane, ethylene carbonate, diethyl carbonate and others, polymers, for example polyvinylidene fluoride (PVDF) or other polymers, solid electrolytes such as $Li_3PO_4N$ and others. For example, liquid electrolytes may be used, for example, electrolytes that do not withstand high temperatures that are higher than 80° C. As is to be clearly understood, also solid or liquid electrolytes that withstand temperatures higher than 80° C. may be used. As will become apparent from the following description, if fluorine-free salts and fluorine-free solvents are used as electrolytes, problems may be avoided when the housing of the battery includes components made of glass.

The separator element 135 spatially and electrically separates the anode 11 and the cathode 12 from each other.

The separator 135 should be permeable for the ions so that a conversion of the stored chemical energy into electrical energy may be accomplished. Examples of the material of the separator element 135 comprise non-woven fabric made of materials such as fiber glass, polyethylene or microporous materials. Further, membranes which are made of microporous sheet that may comprise several layers may be employed. Further examples comprise non-woven fabric which is coated with a ceramic material. As is to be clearly understood, the separator element 135 may be dispensed with.

The battery 2 may be a rechargeable or secondary lithium ion battery. According to a further embodiment, the battery may be a primary battery which is not rechargeable. The battery 2 shown in FIG. 1 has an improved capacity for energy storage, since silicon has a large capacity of insertion of lithium. In other words, the amount of lithium atoms that can be stored or inserted in silicon is much larger than in conventional cases. Since—as will be discussed in the following—the first substrate may comprise a semiconductor material, general semiconductor processing methods may be employed. In particular, methods for manufacturing miniaturized sizes can effectively applied for manufacturing a battery having a small size in comparison to conventional batteries. Further, components of integrated circuits may be easily integrated with the battery 2.

The battery 2 shown in FIG. 1 comprises a first substrate 100 having a first main surface 110 and a second main surface 120. A depression is formed in the first main surface 110, followed by a patterned structure 125, including trenches, for example. The first substrate may comprise semiconductor material. A second substrate 155 is bonded to a carrier 150. For example, the second substrate 155 may be bonded to a first main surface 151 of the carrier 150. In the context of the present specification, a main surface need not be a planar surface. As is shown in FIG. 1, the first main surface 151 is the surface opposite to the second main surface 153 of the carrier 150. An opening 152 is formed in the second surface of the carrier 150 to uncover a portion of the second main surface of the second substrate 155. The second main surface of the carrier is attached to the first substrate 100. Thereby, a cavity is formed between the first substrate 100 comprising the depression, the carrier 150 including the opening 152 and the second substrate 155 that is bonded to the carrier 150. As becomes apparent from FIG. 1, the lateral extension d1 of the second substrate is smaller than the lateral extension d2 of the first substrate 100.

The carrier 150 may be made of an insulating material such as glass. The second substrate 155 may comprise a conducting or a semiconductor material.

According to the embodiment shown in FIG. 1, the carrier 150 is provided so as to insulate the second substrate 155 and the first substrate 100. The first substrate 100 may comprise a semiconductor material or a base layer comprising a semiconductor material. A conductive layer 145 or a patterned conductive layer 145 may be disposed at the second main surface 120 of the first substrate 100. The battery 2 of FIG. 1 further comprises a protective conductive layer 157 lining the opening 152 formed in the layer stack comprising the carrier 150 and second substrate 155. The protective layer 157 prevents a contact between the cathode material 159 and the material of the second substrate 155.

The integrated circuit shown in FIG. 1 may further comprise different circuit elements 140 such as conductive lines 141, 144, resistors 142, transistors 143, and further switches, for example.

The integrated circuit 140 and the circuit elements may be arranged in or on an arbitrary semiconductor material. For example, they may be arranged adjacent to the second main surface 120 of the first substrate or adjacent to the first main surface 154 of the second substrate 155.

In the following, a method of manufacturing such a battery will be explained while referring to FIGS. 2A to 2F. A first substrate 100 which may comprise a semiconductor material is prepared so as to establish an anode of a lithium ion battery. In particular, a depression is formed, followed by trenches 125 so as to form a patterned surface. A back side metallization (element) 145 may be formed on the second main surface 120 of the first substrate.

Figure 2A:
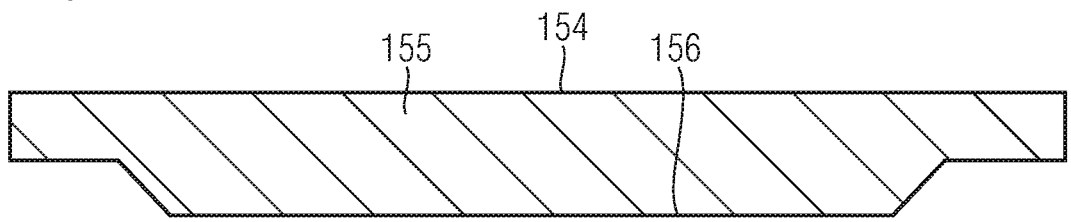
FIGS. 2A to 2F illustrate a method of manufacturing an integrated circuit including a lithium ion battery according to an embodiment.

A second main surface 156 of a second substrate 155 which may comprise a conductive material such as a metal or an arbitrary semiconductor material, such as silicon is patterned so as to form a protruding portion (FIG. 2A).

Figure 2B:
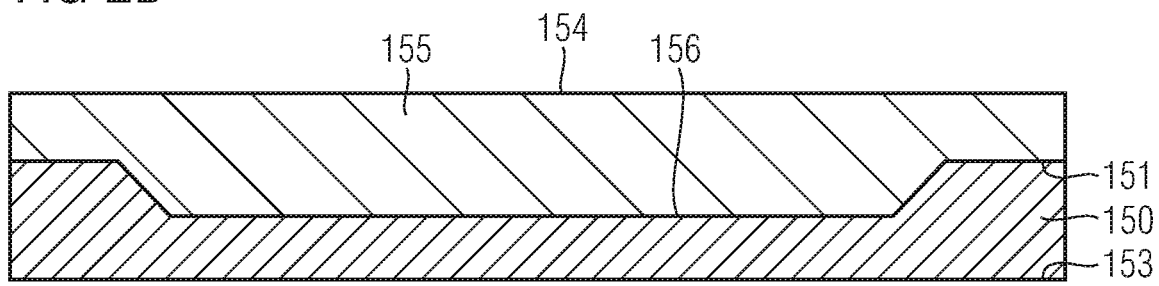

The patterned second main surface of the second substrate 155 is bonded to a carrier 150. For example, the carrier may be an insulating layer such as a glass carrier. The carrier 150 may comprise any other transparent material such as a polymer. The second substrate 155 is bonded with a carrier 150, for example, by hot embossing. As is generally known, according to the hot embossing method, the second substrate 155 and the carrier 150 are heated to a temperature above the glass transition point. As a result, the carrier adapts its shape to the surface of the second substrate 155. As a result the bonded substrates form planar main surfaces (FIG. 2B).

Generally, as a result of this processing sequence according to which the second substrate 155 having a protruding portion is bonded to the carrier using a hot embossing method, the second substrate 155 is embedded into the carrier 150. A resulting surface of the bonded layers includes material of the second substrate 155 as well as material of the carrier 150. Bonding the second substrate 155 to the carrier 150 using a hot embossing method results in a compact housing, since the second substrate 155 is embedded into the carrier 150. The hot embossing method is performed at an earlier processing step than filling the liquid electrolyte into the cavity, so that the high temperature applied will not affect the liquid electrolyte.

Figure 2C:
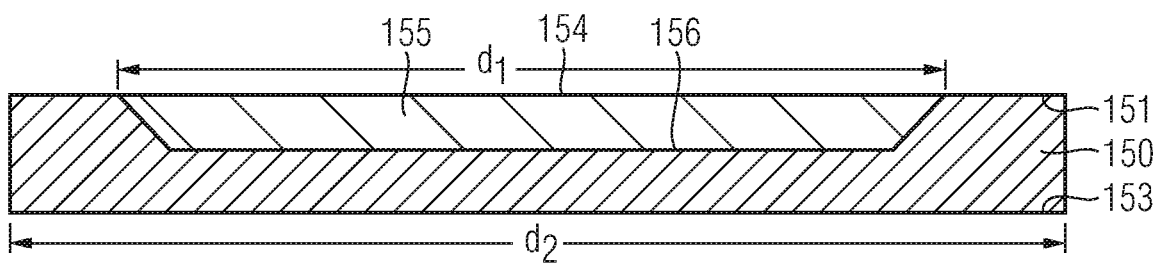
Figure 2D:
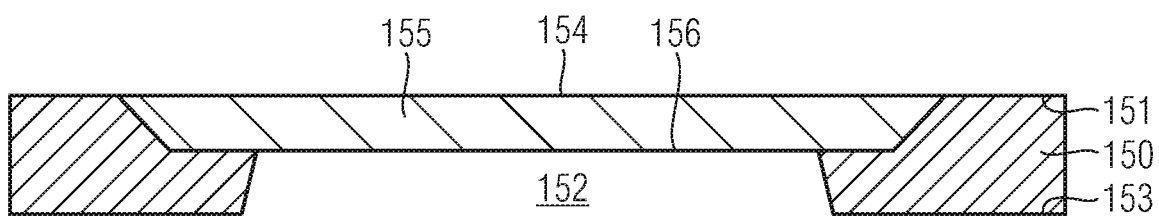

Thereafter, a grinding step, a CMP (chemical mechanical polishing) step, an etching step or a combination of these processes is performed so as to remove portions of the second substrate 155 that are disposed over a protruding portion of the first main surface 151 of the carrier 150. As a result, an edge portion of the first main surface 151 of the carrier 150 is uncovered (FIG. 2C). Then, an opening 152 is formed in the second main surface 153 of the carrier 150 to uncover a portion of the second main surface 156 of the second substrate 155. A cross-sectional view of the resulting structure is shown in FIG. 2D.

Figure 2E:
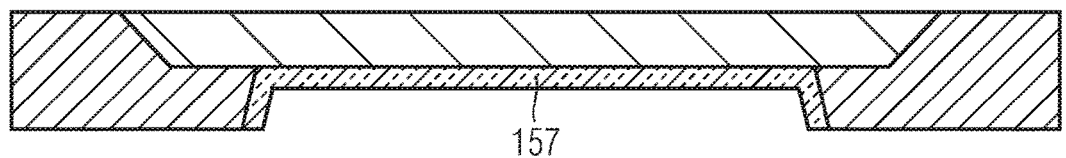

Thereafter, a protective conductive layer 157 is formed over the surface of the resulting opening 152. For example, the protective conductive layer 157 may be made of aluminium (Al). FIG. 2E shows as cross-sectional view of a resulting structure.

Then the material forming the cathode, such as NCA (NiCoAl oxide including intercalated lithium) may be filled in the opening 152. Further, a top metallization contact 158 may be formed over and in contact with the remaining portion of the second substrate 155.

An electrolyte 130 may be filled in the depression formed in the first substrate 100, followed by a separator element 135. Then, the cell filled with the electrolyte 130 may be sealed using a UV curable adhesive 160 that is disposed between the horizontal portions of the first substrate 100 and the edge portions of the carrier 150. Due to the feature that the carrier 150 is made of a transparent material, UV light may be irradiated through the edge portion of the carrier 150. As a result, a cavity 162 is formed between the first substrate 100, the carrier 150 and the second substrate 155.

Figure 2F:
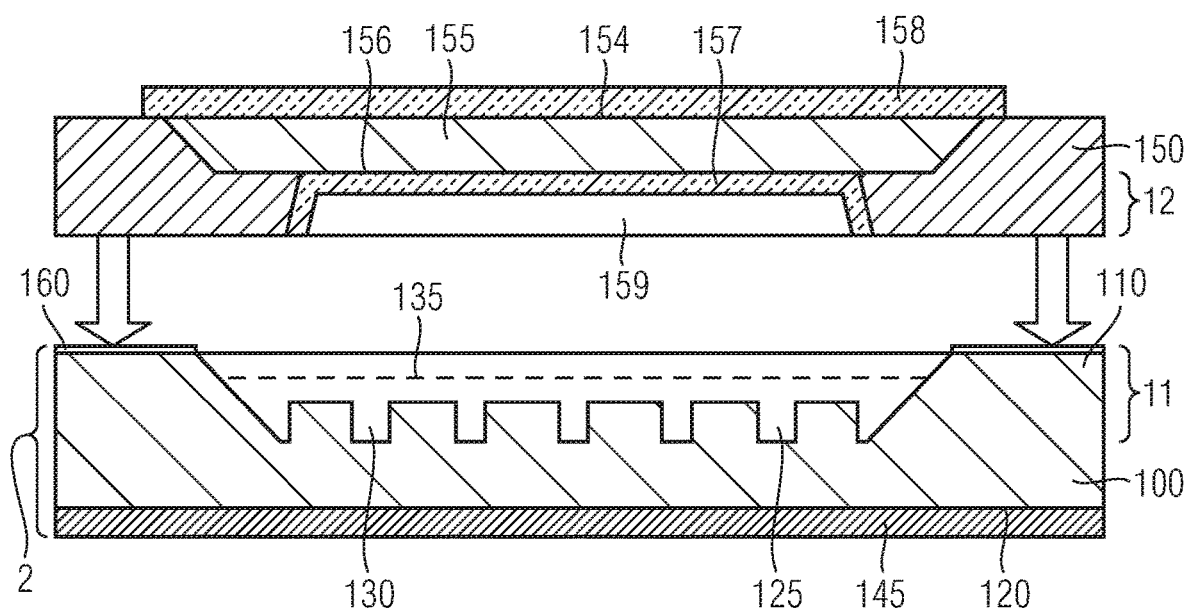

FIG. 2F shows a cross-sectional view of the substrates 100, 155 and the carrier 150 when being assembled. As is shown, the battery comprises a first substrate 100 having a first main surface 110 and a second substrate 155 made of a conducting or a semiconductor material. The battery further comprises a carrier 150 of an insulating material, having a first 151 and a second main surface 153. The second substrate 155 is attached to the first main surface 151 of the carrier and an opening is formed in the second main surface 153 of the carrier 150 to uncover a portion of the second main surface 156 of the second substrate 155. The second main surface 153 of the carrier 150 is attached to the first main surface 110 of the first substrate 100, thereby forming a cavity 162. An electrolyte 130 is disposed in the cavity 162.

Figure 2G:
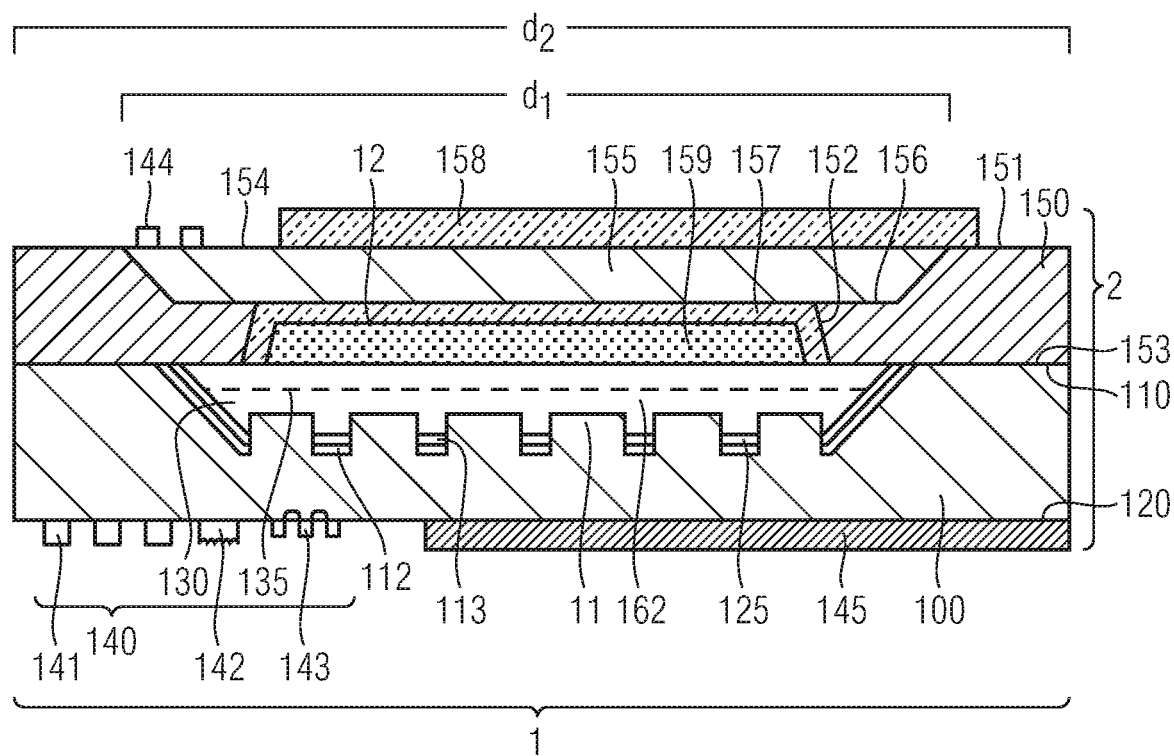
FIGS. 2G and 2H illustrate general modifications of the battery.
Figure 2H:
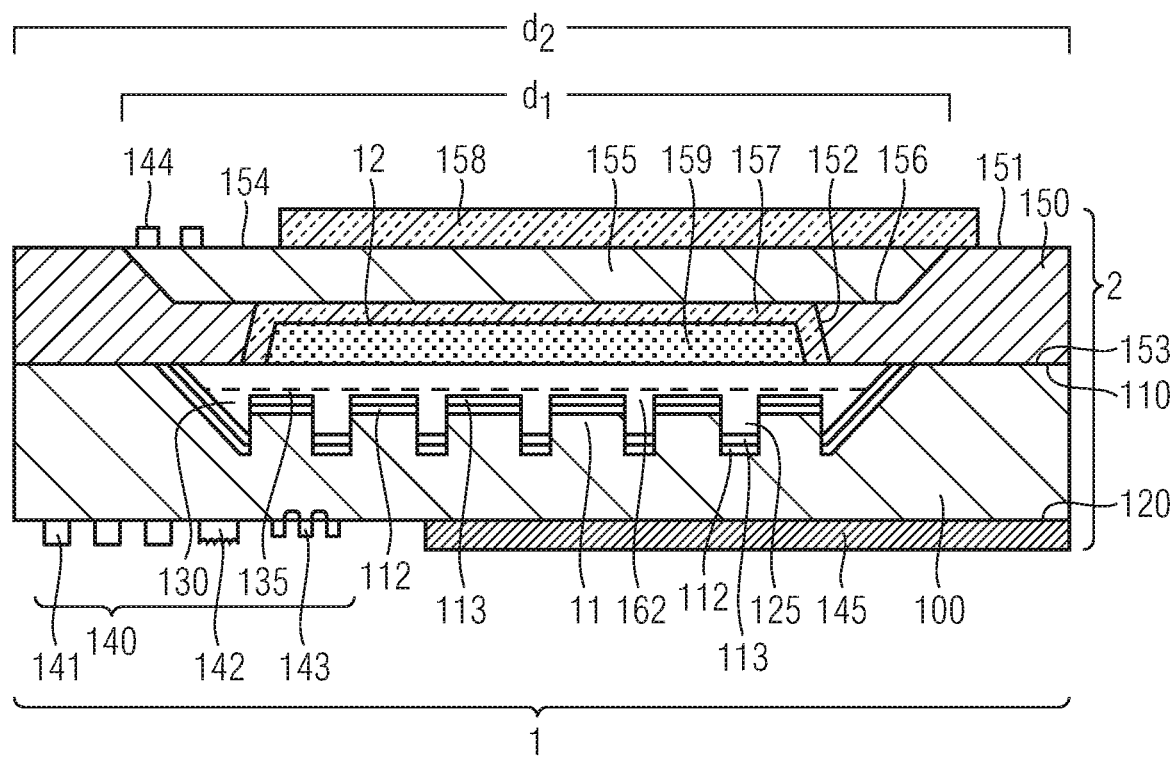

FIG. 2G shows a modification of the structure shown in FIG. 1. As is shown, the lithium ion battery may further comprise a barrier layer (stack) that may be formed over portions of the anode. For example, the barrier layer may comprise a metal layer 112 such as TiW. Optionally, the barrier layer stack may further comprise an oxide layer 113 such as silicon oxide. For example, such an oxide layer may be formed by a PECVD (plasma enhanced chemical vapour deposition) method. The barrier layer (stack) may prevent the diffusion of lithium into the silicon at certain positions. The barrier layer (stack) may comprise a metallic layer alone or in combination with another metallic or oxide layer. As is illustrated in FIG. 2G, the barrier layer (stack) may be disposed in the trenches 125. According to the modification shown in FIG. 2H, the barrier layer (stack) may be disposed in the trenches 125 and in the silicon pillars between adjacent trenches 125. Differently stated, according to the modification shown in FIG. 2H, the barrier layer (stack) is disposed over horizontal portions of the anode 11. As is to be clearly understood, the barrier layer (stack) may be combined with any of the embodiments described herein.

FIG. 3 shows a cross-sectional view of the integrated circuit 1 according to a further embodiment. The battery 2 of FIG. 3 comprises a housing including the first substrate 200, a second substrate 255 and a carrier 250. Differing from the embodiment of FIG. 1, in the embodiment of FIG. 3 the anode is formed in the second substrate 255 and the cathode is formed at the first substrate 200. The carrier 250 may be made of an insulating material such as glass. The further components of the integrated circuit shown in FIG. 3 are similar to those illustrated in FIG. 1. FIG. 3 further shows elements 241, 242 of an integrated circuit 240 that may be arranged on the first substrate. The lateral extension of the cathode layer 259 is smaller than the lateral extension of the first substrate 200.

FIGS. 4A to 4E illustrate a method of forming the battery according to this embodiment.

A first substrate 200 is prepared by forming a conductive layer 201 such as an aluminum layer over the first main surface of a first substrate 200. Then, the cathode material 299 such as NCA which acts as a Li source is deposited and patterned so as to form the cathode 12. Further, a second substrate 255 is patterned so as to form a plurality of grooves 225. (FIG. 4A)

The patterned second substrate 255 is bonded with a carrier 250, for example, by hot embossing to form a substrate stack having two planar surfaces. (FIG. 4B).

Thereafter, a CMP step, a grinding step, an etching step or a combination of these processes is performed so as to remove a portion of the protruding second substrate 255. As a result, an edge portion of the first main surface 251 of the carrier 250 is uncovered. FIG. 4C shows a cross-sectional view of a resulting structure.

Thereafter, an opening 252 is etched in the carrier 250 to uncover a portion of the second main surface of the second substrate 255. Further, a metallization layer 245 is formed on the first main surface of the second substrate. FIG. 4D shows an example of resulting structure as well as of the first substrate 200 including the conductive layer 201 and the cathode layer 299.

The cell is filled with a liquid electrolyte 230 as well as a separator element 235. The carrier 250 including the second substrate 255 is bonded to the first substrate 220 using a UV curable adhesive 260. FIG. 4E shows a cross-sectional view of an example of this process. The other components of an integrated circuit may be formed on the processed first substrate. According to a further embodiment, components of the integrated circuit may be formed before assembling the battery. According to this implementation, the electrolyte is not subjected to a high temperature processing when forming the components 241, 242 of the integrated circuit.

Figure 5:
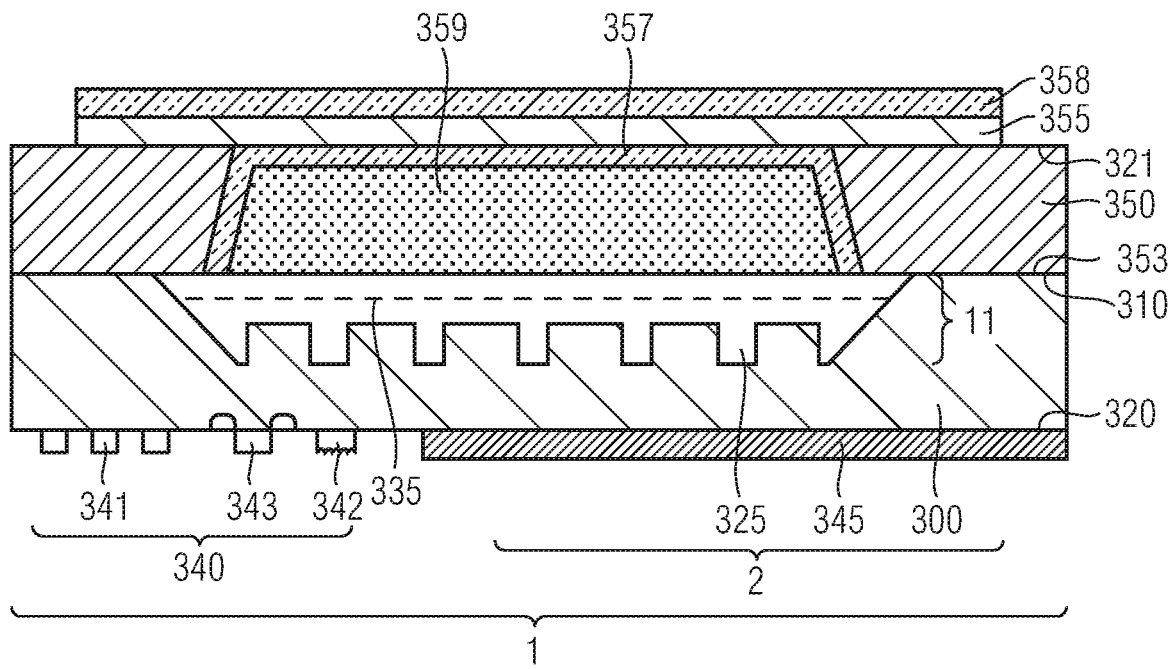
FIG. 5 shows a cross-sectional view of an integrated circuit including a lithium ion battery according a further embodiment.

FIG. 5 shows a cross-sectional view of an integrated circuit comprising a battery according to a further embodiment. Embodiment of FIG. 5 comprises similar components as the embodiment of FIG. 1, wherein the reference numeral of the respective components is incremented by "200". Differing from the embodiment illustrating in FIG. 1, the semiconductor material is not embedded into the insulator layer, but is formed as a layer disposed over the insulating substrate 350. Due to this different construction, different materials may be used and a different method of manufacturing may be employed. The integrated circuit further comprises circuit elements 341, 342, 343 that may be disposed adjacent to the second main surface 320 of the first substrate 300. Further circuit elements may be disposed at the second substrate 355, for example, in regions where the metallization layer 358 is absent.

Figure 6A:
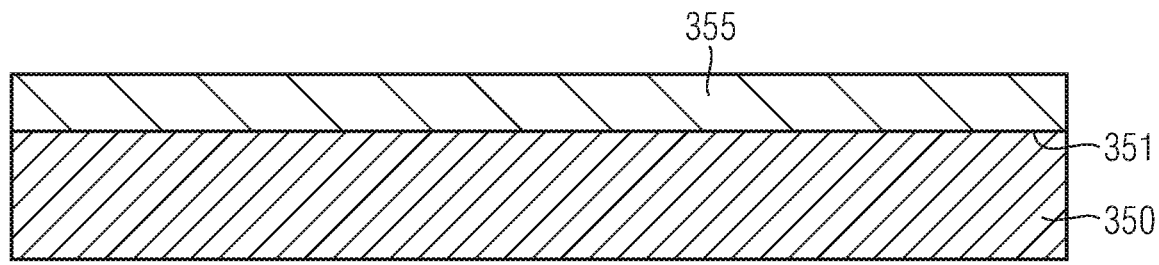
FIGS. 6A to 6F illustrate a further method of manufacturing an integrated circuit including a lithium ion battery according to an embodiment.

A process for manufacturing the integrated circuit shown in FIG. 5 will be explained in the following by referring to FIGS. 6A to 6F. After preparing a first substrate 300 in a similar manner as has been explained with reference to FIG. 2A to 2F, a planar semiconductor wafer 355 is bonded with a carrier 350 made of an insulating material. For example, the semiconductor wafer 355 may be bonded to the carrier 350 using anodic bonding or another bonding method suitable for bonding planar surfaces. For example, the carrier 350 may be a glass wafer or any other wafer made of an insulating material (FIG. 6A)

Figure 6B:
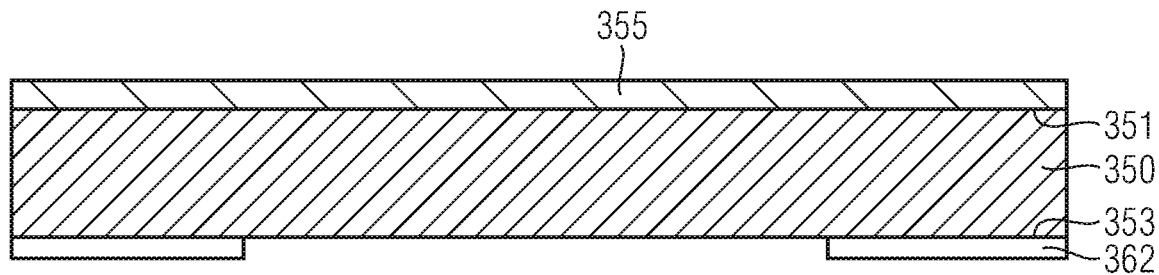

Then, a hard mask layer 362 is formed adjacent to the second main surface 353 of the carrier 350. The hard mask layer 362 is patterned to form an opening for etching an opening in the glass carrier (FIG. 6B).

Figure 6C:
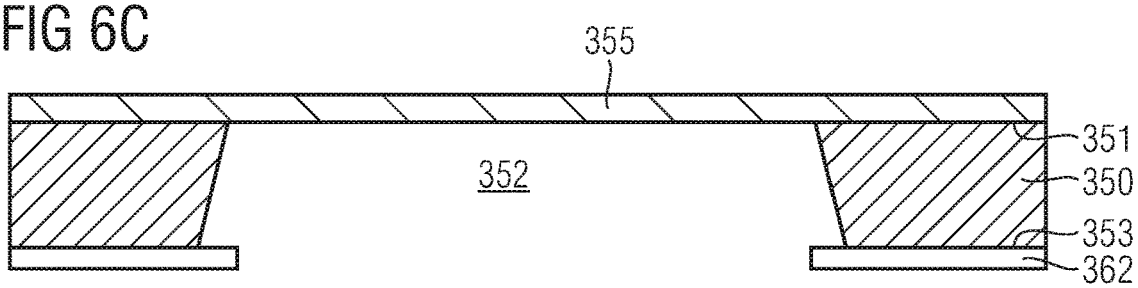

Thereafter, an etching step, e.g. using HF (hydrofluoric acid) as an etchant is performed so as to define an opening 352 in the carrier 350. The opening 352 is formed so as to contact the semiconductor wafer 355 (FIG. 6C).

Figure 6D:
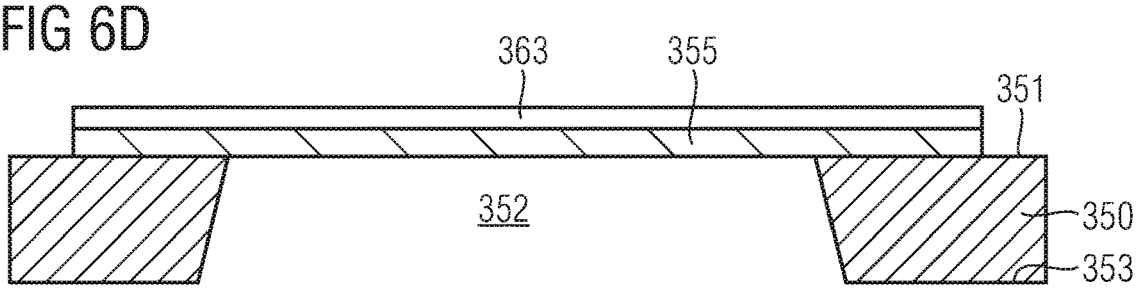

Thereafter, a further hard mask layer 363 is formed on the top surface 356 of the second substrate 355. The hard mask layer 363 is patterned so as to form a hard mask, thereby leaving the edge portions of the second substrate 355 uncovered. Then, an etching step of etching the second substrate is performed so as to uncover portions of the first main surface 351 of the carrier 350. Due to this patterning step, the edge portions of the combined substrates becomes transparent for UV light which enables later processing using an UV curable adhesive. FIG. 6D shows a cross-section of a resulting structure.

According to a modification of the method described above, the carrier 350 may first be patterned, e.g. by etching the opening 352, followed by attaching the carrier 350 to the second substrate 355. According to an implementation, the above steps of removing an edge portion of the second substrate 355 may be performed in the manner as has been described above. Alternatively, the carrier 350 may be attached to the second substrate 355 in a manner so that an edge portion of the carrier 350 is not covered by the second substrate 355.

Figure 6E:
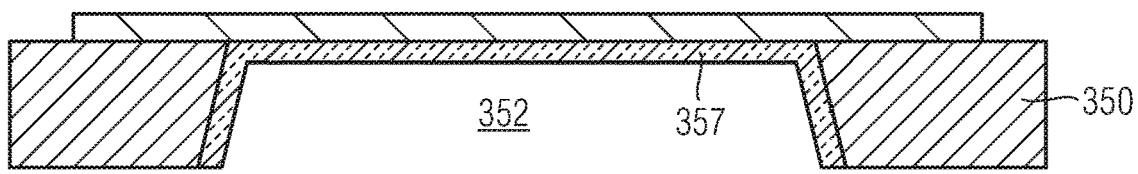
Figure 6F:
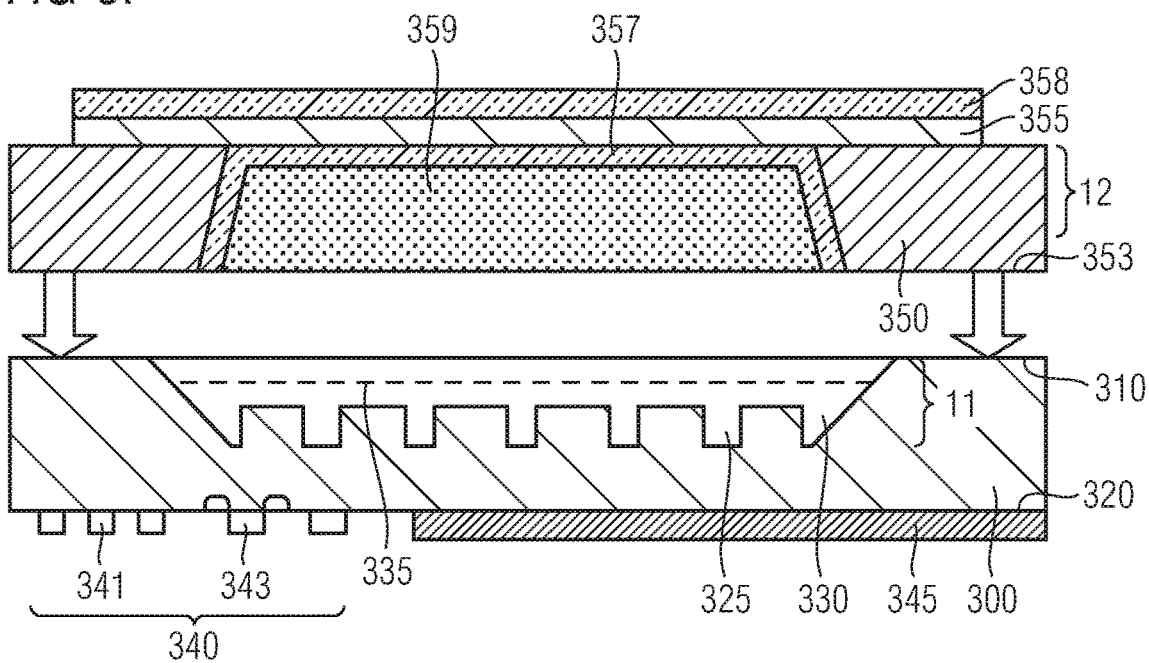

Thereafter, a protective conductive layer 357 such as an aluminum layer is formed on the surface of the resulting opening 352. Any material that may prevent a contact of the lithium source and the semiconductor material 355 may be used as the material of the protective conductive layer 357. Due to the presence of the protective conductive layer 357, diffusion of the lithium atoms in the semiconductor material of the second wafer 355 may be prevented. The cross-sectional view of a resulting structure is shown in FIG. 6E.

A conductive layer 358 is formed on the top surface of the semiconductor wafer 355 so as to provide an electrical contact. Further, the lithium source 359 is filled into the opening 352. When assembling the first substrate 300, the carrier 350 and the second substrate (semiconductor wafer) 355, a cavity 354 is formed. The liquid electrolyte 330 and the separator element 335 are filled in the cavity 354. Thereafter, the second main surface 353 of the carrier 350 is bonded to the first main surface 310 of the first substrate 300 as indicated by the downward facing arrows in FIG. 6F. For example, this may be accomplished using an UV curable adhesive.

Figure 7:
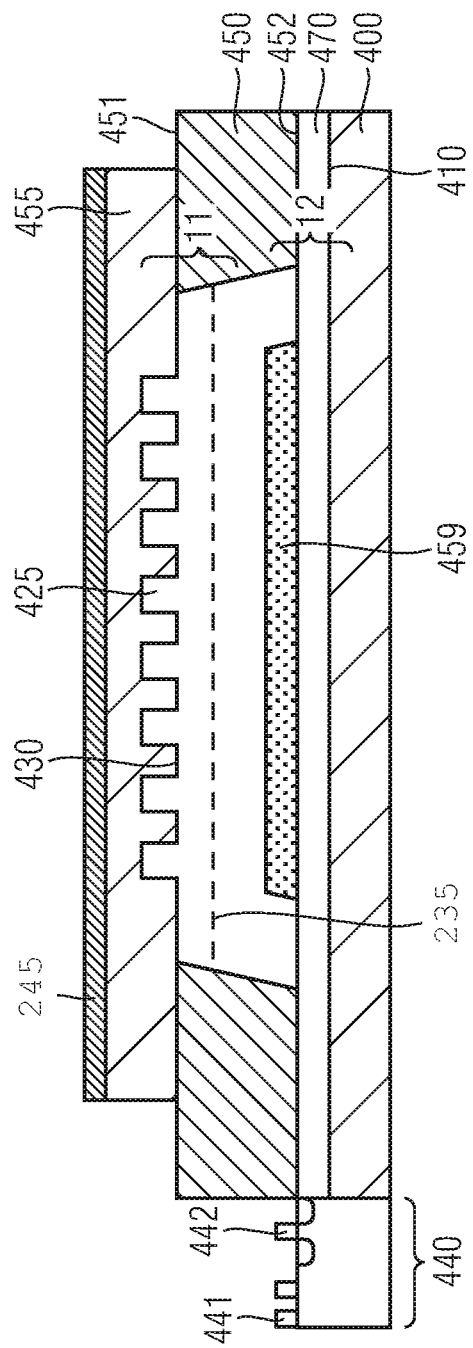
FIG. 7 shows a cross-sectional view of an integrated circuit including a lithium ion battery according to a further embodiment.

FIG. 7 shows a further embodiment of an integrated circuit including a battery. The integrated circuit of FIG. 7 comprises similar components as the embodiment of FIG. 3, wherein the reference numerals of the respective components are incremented by "200". Differing from the embodiment illustrated in FIG. 3, the second substrate 455 is not embedded into the carrier 450 but formed as a separate layer over the second substrate 450. Due to this different structure, different manufacturing processes may be employed. According to the embodiment shown in FIG. 7, the anode is formed in the second substrate 455, whereas the cathode is formed at the first substrate 400. Components of integrated circuit 440 such as conductive lines 441, transistors 442 may be formed in uncovered semiconductor surfaces, optionally, after removing a portion of a cover layer. As is illustrated in FIG. 7, components of the integrated circuit may be disposed at an uncovered portion of the first main surface 410 of the first substrate 400.

Figure 8A:
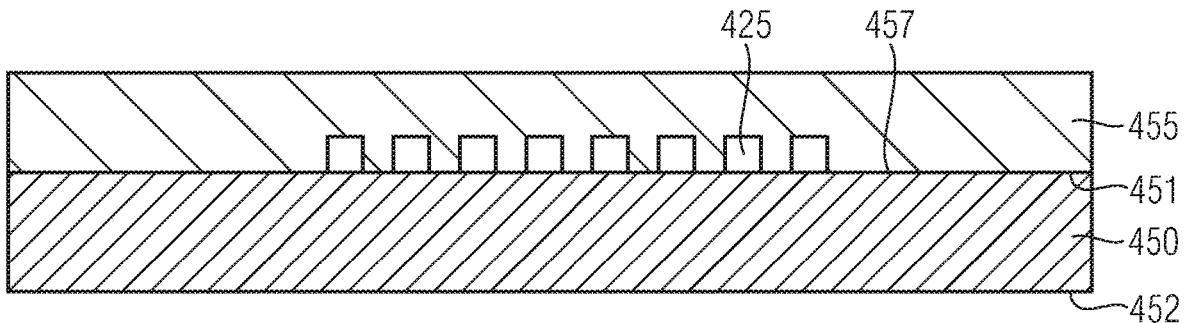
FIGS. 8A to 8F illustrate still a further embodiment of a method of manufacturing an integrated circuit.

A method of manufacturing such an integrated circuit will be explained in the following while referring to FIGS. 8A to 8F. A second substrate 455, e.g. a silicon substrate, is patterned to form grooves 425 in the second main surface 457 thereof (FIG. 8A).

Figure 8B:
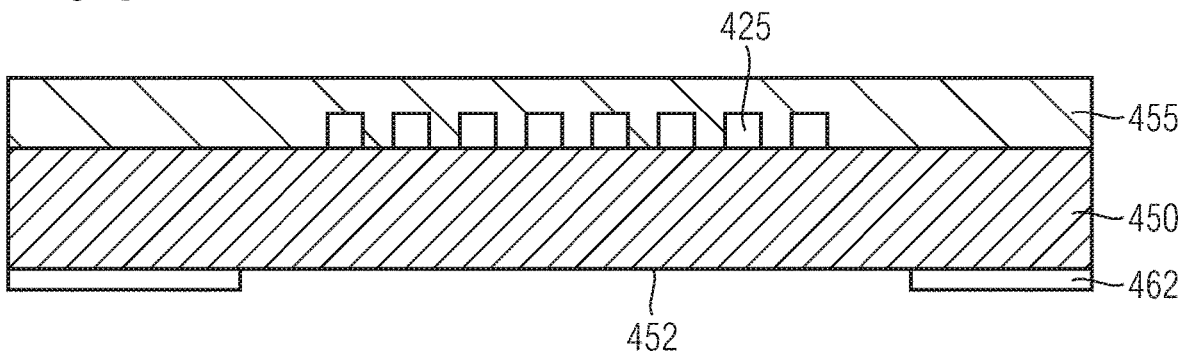

Then, the second substrate 455 is bonded to a carrier 450, e.g. using anodic bonding. The carrier 450 may be made of an insulating material and may, for example, comprise a glass substrate. As a result of the bonding of the patterned second substrate 455 to the carrier 450, the grooves 425 are not filled with the carrier material, but spaces remain between the substrate material and the carrier material. Thereafter, a hard mask layer 462 is formed adjacent to a second surface 453 of the carrier 455. The hard mask layer 462 is patterned to form an opening for defining an opening in the carrier. A cross-sectional view of a resulting structure is shown in FIG. 8B.

Figure 8C:
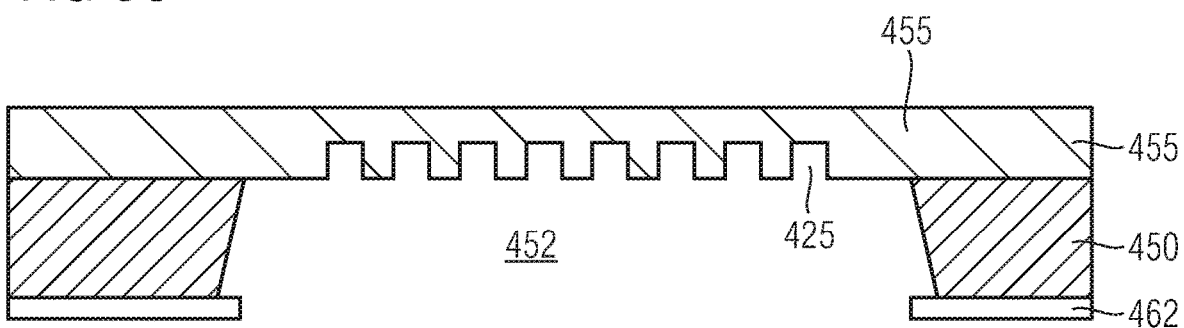

Thereafter, an etching step is performed, e.g. using HF (hydrofluoric acid), for etching the opening 452 in the second main surface 453 of the carrier 450. The semiconductor wafer 455 serves as an etching stop. The etching step is performed so as to expose the second surface 457 of the second substrate 455. FIG. 8C shows a cross-sectional view of a resulting structure.

Figure 8D:
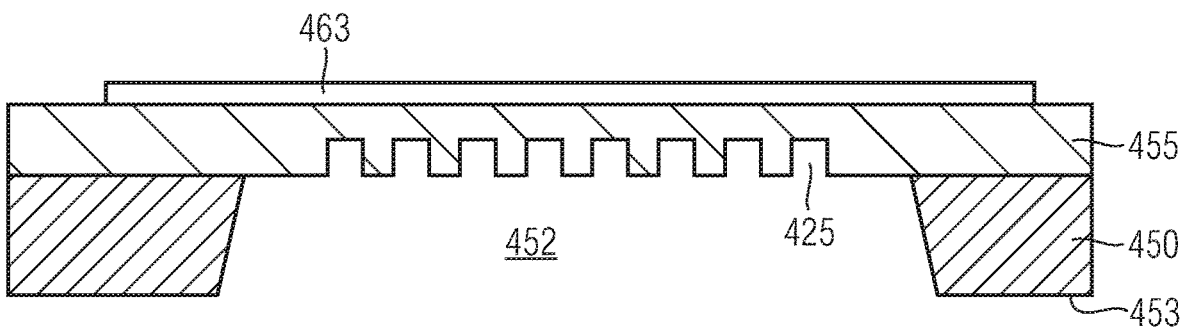
Figure 8E:
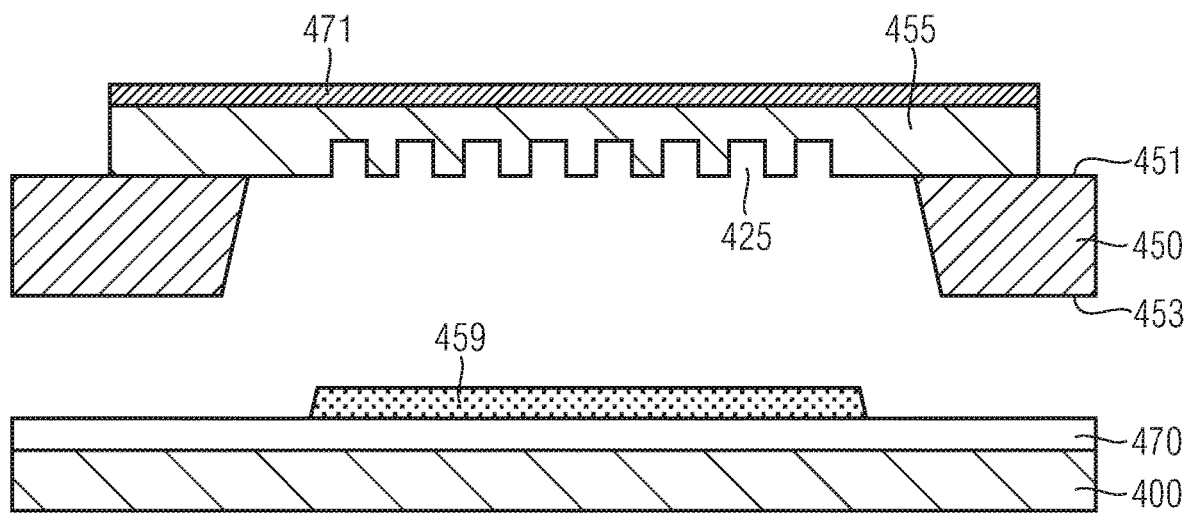

Thereafter, a further hard mask layer 463 is formed on the first main surface 456 of the second substrate 455. The hard mask layer 463 is patterned so as to uncover edge portions of the second substrate 455 (FIG. 8D). Thereafter, an etching step is performed so as to remove the edge portions of the second substrate 455, thereby uncovering a portion of the first surface 451 of the carrier 450. Then, a further conductive layer 471 is formed on the first main surface 456 of the second substrate 455. For example, Cu may be deposited as a conductive layer. Thereafter, a first substrate 400 is prepared so as to form the cathode of the battery. The first substrate may comprise a semiconductor substrate, e.g. silicon. A conductive layer 470 such as made of aluminum is formed on the first main surface 410 of the first substrate 400. Then, NCA as a lithium source is deposited on the Al layer. For example, the NCA layer 459 may be patterned using lithographical methods or may be formed using a screen printing method as is commonly known. FIG. 8E shows cross-sectional views of correspondingly processed first and second substrates.

Thereafter, the carrier 450 may be bonded to the conductive layer 470 disposed over the first substrate 400 using an UV curable adhesive 460. Since an edge portion of the first surface 451 of the carrier 450 is not covered by the second substrate 455, this portion is transparent to UV radiation so that UV light may be transmitted across the carrier 450 to accomplish curing of the adhesive.

Figure 8F:
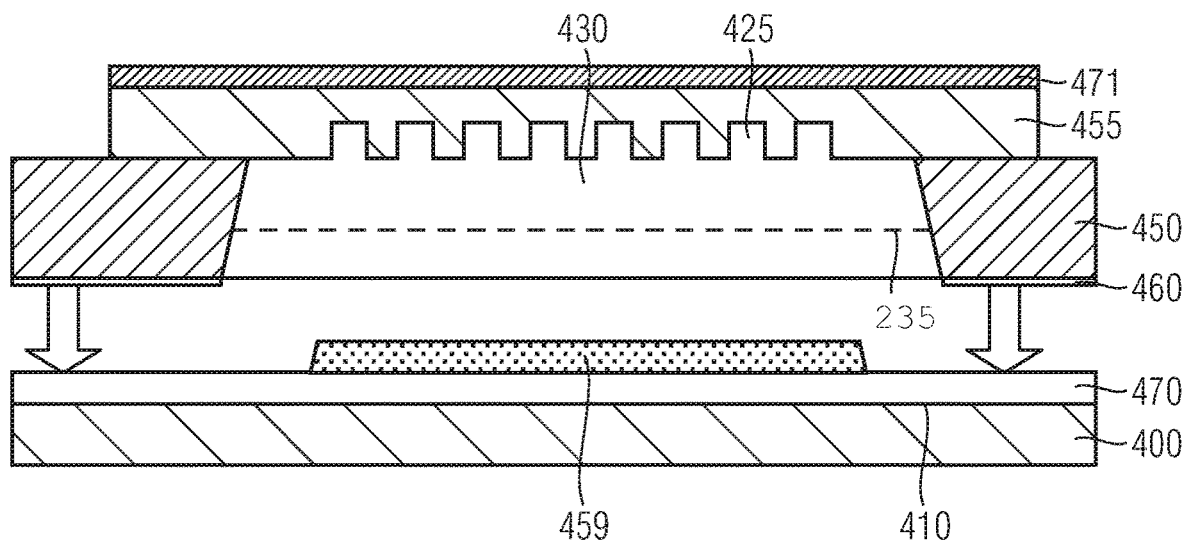

FIG. 8F shows an example of the first and second substrates 400, 455 when being bonded together.

FIG. 9 summarizes a method of manufacturing a battery according to an embodiment. The method comprises forming a cavity in a stack including a first substrate, a carrier of an insulating material, and a second substrate made of a conductive or a semiconductor material. In particular, the method comprises attaching a second main surface of the second substrate to a first main surface of the carrier (S10), forming an opening in the second main surface of the carrier to uncover a portion of a second main surface of the second substrate (S20), filling an electrolyte in the cavity (S30), and attaching a first main surface of the first substrate to a second main surface of the carrier (S40).

As is clearly to be understood, the integrated circuits described herein above may be also manufactured using different methods. The described processing methods are especially useful when taking into account the thermal budget limitation that is imposed by the Li ion galvanic MEMS battery architecture. According to further embodiments, other wafer bonding techniques may be used for the formation of the enclosure such as anodic bonding, diffusion bonding, eutectic bonding etc., which are able to provide a stable and hermetic enclosure system.

Due to the presence of the carrier 150, 250, 350, 450 that is disposed between the first substrates 100, 200, 300, 400 and the second substrate 155, 255, 355, 455, the first substrate and the second substrate may form a cavity for housing the battery in which the cathode is electrically insulated from the anode. Due to the specific arrangement of the anode and the cathode, interconnections may be provided to the battery so as to establish a substantially vertical interconnection.

According to the embodiments described above, the integrated circuit 1 comprises a battery 2 and integrated circuit elements 140, 240, 340, 440. Components of the battery and the integrated circuit elements may be disposed on the same semiconductor substrate or semiconductor chip. According to further embodiments, the battery and elements of an electric circuit may be disposed on separate semiconductor substrates or chips. When the battery and the electric circuit are disposed on separate chips, the battery may be electrically coupled to the electric circuit via an interconnection.

Generally, within the context of the present specification, the electric circuit or the integrated circuit may comprise a processing device for processing data. The electric circuit or the integrated circuit may further comprise one or more display devices for displaying data. The electric circuit or the integrated circuit may further comprise a transmitter for transmitting data. The electric device or the integrated circuit may further comprise components which are configured to implement a specific electronic system. According to an embodiment, the electric device or the integrated circuit may further comprise an energy harvesting device that may deliver electrical energy to the battery 2, the energy having been generated from solar, thermal, kinetic or other kinds of energy. For example, the electric device or the integrated circuit may be a sensor such as a tire pressure sensor, wherein the electric circuit or the integrated circuit further comprises sensor circuitry and, optionally, a transmitter that transmits sensed data to an external receiver. According to another embodiment, the electric device or the integrated circuit may be an actuator, an RFID tag or a smartcard. For example, a smartcard may additionally comprise a fingerprint sensor, which may be operated using energy delivered by the battery 2.

While embodiments of the invention have been described above, it is obvious that further embodiments may be implemented. For example, further embodiments may comprise any subcombination of features recited in the claims or any subcombination of elements described in the examples given above. Accordingly, the spirit and scope of the appended claims should not be limited to the description of the embodiments contained herein.

What is claimed is:

1. A battery, comprising:
   a first substrate having a first main surface;
   a second substrate made of a conducting material or a semiconductor material;
   a carrier of an insulating material, having first and second main surfaces, the second substrate being embedded into the carrier so that the second substrate comprises portions directly adjacent to the carrier, the portions vertically overlapping with the carrier;
   an opening in the second main surface of the carrier to uncover a portion of a second main surface of the second substrate, the second main surface of the carrier being attached to the first substrate, thereby forming a cavity; and
   an electrolyte disposed in the cavity.

2. The battery according to claim 1, wherein the battery is a lithium ion battery having an anode comprising a component made of silicon.

3. The battery according to claim 2, wherein the anode of the battery is formed at the first substrate, and a cathode of the battery is formed at the second substrate.

4. The battery according to claim 2, wherein the anode of the battery is formed at the second substrate, and a cathode of the battery is formed at the first substrate.

5. The battery according to claim 1, wherein the second substrate includes a patterned structure.

6. The battery according to claim 1, further comprising a liquid electrolyte.

7. An integrated circuit including a lithium ion battery comprising:
   a first substrate having a first main surface;
   a second substrate made of a conducting or semiconductor material, an anode of the lithium ion battery being an integral constituent part of the first or second substrate;
   a carrier of an insulating material, having a first and a second main surfaces, the second substrate being attached to the carrier;
   an opening in the second main surface of the carrier to uncover a portion of a second main surface of the second substrate, the second main surface of the carrier being attached to the first main surface of the first substrate, thereby forming a cavity; and
   an electrolyte disposed in the cavity.

8. The integrated circuit according to claim 7, further comprising circuit elements in the first substrate.

9. The integrated circuit according to claim 7, further comprising circuit elements in the second substrate.

10. A method of manufacturing a battery, the method comprising:
    forming a cavity in a stack including a first substrate, a carrier of an insulating material, and a second substrate made of a conductive or a semiconductor material;
    patterning a second main surface of the second substrate, thereafter, attaching the second main surface of the second substrate to a first main surface of the carrier by hot embossing, followed by removing portions of a first main surface of the second substrate;
    forming an opening in the second main surface of the carrier to uncover a portion of a second main surface of the second substrate;
    attaching a first main surface of the first substrate to a second main surface of the carrier; and
    filling an electrolyte in the cavity.

11. The method according to claim 10, further comprising patterning the second surface of the second substrate to have a protruding portion before attaching the second substrate to the carrier.

12. The method according to claim 10, further comprising forming a protective conductive layer over the uncovered portion of the second main surface of the second substrate.

13. The method according to claim 10, further comprising forming an anode of the battery at the first surface of the first substrate.

14. The method according to claim 10, further comprising forming an anode of the battery at the second main surface of the second substrate.

15. The method according to claim 11, wherein the second substrate is attached to the carrier using anodic bonding.

16. The method according to claim 10, further comprising patterning the second main surface of the second substrate to form a plurality of grooves in the second main surface before attaching the second substrate to the carrier.

17. The method according to claim 16, wherein a surface of the grooves is uncovered after forming the opening in the second main surface.

18. The method according to claim 10, further comprising removing a portion of the second substrate to uncover a portion of the first main surface of the carrier.

19. The integrated circuit of claim 7, wherein the carrier is a glass carrier.

20. The battery of claim 1, wherein the carrier is a glass carrier.

* * * * *

UNITED STATES PATENT AND TRADEMARK OFFICE
CERTIFICATE OF CORRECTION

PATENT NO. : 10,749,216 B2
APPLICATION NO. : 14/230056
DATED : August 18, 2020
INVENTOR(S) : R. Joshi et al.

Page 1 of 1

It is certified that error appears in the above-identified patent and that said Letters Patent is hereby corrected as shown below:

On the Title Page

Abstract, Line 4, please change "main surfaces" to -- main surface --

In the Claims

Column 11, Line 37 (Claim 7, Line 8) please change "main surfaces" to -- main surface --

Signed and Sealed this
First Day of March, 2022

Drew Hirshfeld
*Performing the Functions and Duties of the
Under Secretary of Commerce for Intellectual Property and
Director of the United States Patent and Trademark Office*